United States Patent
Frisch et al.

(10) Patent No.: US 8,719,195 B2
(45) Date of Patent: May 6, 2014

(54) BATTERY ADAPTIVE LEARNING MANAGEMENT SYSTEM

(75) Inventors: Israel Frisch, Seattle, WA (US); Ingrid Lapins, Renton, WA (US)

(73) Assignee: The Boeing Company, Chicago, IL (US)

(*) Notice: Subject to any disclaimer, the term of this patent is extended or adjusted under 35 U.S.C. 154(b) by 274 days.

(21) Appl. No.: 13/269,965

(22) Filed: Oct. 10, 2011

(65) Prior Publication Data

US 2013/0091083 A1 Apr. 11, 2013

(51) Int. Cl.
G06F 15/18 (2006.01)
G06N 99/00 (2010.01)

(52) U.S. Cl.
CPC .................................. *G06N 99/005* (2013.01)
USPC ................ 706/14; 703/13; 320/137; 324/426

(58) Field of Classification Search
None
See application file for complete search history.

(56) References Cited

U.S. PATENT DOCUMENTS

| | | | | |
|---|---|---|---|---|
| 6,920,404 | B2 * | 7/2005 | Yamanaka ...................... | 702/63 |
| 2007/0046261 | A1 * | 3/2007 | Porebski ........................ | 320/132 |
| 2009/0027056 | A1 * | 1/2009 | Huang et al. .................. | 324/439 |
| 2013/0069658 | A1 * | 3/2013 | Rich et al. ..................... | 324/426 |

OTHER PUBLICATIONS

Codeca, Fabio, Savaresi, Sergio, M., and Manzoni, Vincenzo, "The mix estimation for battery State-of-Charge estimator—Analysis of the sensitivity to measurement errors", Joint 48th IEEE Conference on Decision and Control and 28th Chinese Control Conference, FRC03.5, 2009 IEEE, pp. 8083-8088.

Ellis, Brian, "Lithium-ion batteries: Safe, economical and environmentally friendly solutions for energy storage", Brian L. Ellis, blellis@sciborg.uwaterloo.ca, University of Waterloo Waterloo ON N2L 3G1, Nov. 2007, Chem news, p. 5.

Gegov, Alexander, E., and Frank, Paul, M., "Hierarchial fuzzy control of multivatiable systems", Fuzzy Sets and systems 72, Eselvier Science B.V., 1995, pp. 299-310.

Karaev, M.V., Zhdanov, A.A., "Construction on Self-Learning Fuzzy Controllers Using Autonomous Adaptive Control Methodology", Journal of Computer and System Sciences, 2007, vol. 46, No. 2, pp. 255-261.

Kalam, R.E., On the General Theory of Control Systems, Air Force Office of Scientific Research, pp. 481-492.

Kalman, R.E., "Mathematical Description of Linear Dynamical Systems", SIAM Journal on Control, vol. 1, 1963, pp. 152-192.

Branicky, Michael, and Borkar, Vivek S., "A Unified Framework for Hybrid Control: Model and Optimal Control Theory", IEEE Transactions on Automatic control, vol. 41, No. 1, Jan. 1998, pp. 31-45.

* cited by examiner

*Primary Examiner* — Alan Chen
(74) *Attorney, Agent, or Firm* — Ameh IP; Lowell Campbell; Elahe Toosi (57) ABSTRACT

A system and methods for battery health diagnostics are disclosed. At least one battery property of a battery is measured in real-time to provide measured data, and at least one measurement time at which the measured data is measured is tracked. A battery history model is provided by adaptively modeling the measured data and the measurement time, and a future state of the battery is estimated based on the battery history model.

20 Claims, 4 Drawing Sheets

BATTERY ADAPTIVE LEARNING MANAGEMENT SYSTEM

FIELD

Embodiments of the present disclosure relate generally to batteries. More particularly, embodiments of the present disclosure relate to state of health and control of a battery and battery charging systems.

BACKGROUND

Prime characteristics of a battery are parameters such as voltage, energy density, capacity, state of charge and internal resistance. These parameters determine a state or health of the battery. Various types of battery applications may comprise automotive, aerospace or circuit board level devices such as an Uninterruptible Power Supply (UPS). Due to an inherent nature of batteries whether non-rechargeable (primary cells) or re-chargeable (secondary cells), properties of the batteries such as electro-chemistries, fabrication techniques, utilization aspects, and battery characteristics will change over time.

SUMMARY

A system and methods for battery health diagnostics are disclosed. At least one battery property of a battery is measured in real-time to provide measured data, and at least one measurement time at which the measured data is measured is tracked. A battery history model is developed by employing the measured data and the measurement time, and a future state of the battery is estimated based on the battery history model along with original equipment manufacturer (OEM) specifications of a battery parameter or characteristic using adaptive logic that employs change rules or other methodologies to adjust and adapt battery characteristics for future state and resultant prognostics.

Embodiments of the disclosure provide a small, low cost and low energy system with onboard memory for battery operational history tracking and modeling. For example, data such as charge, discharge, dates, times, or other data, can be tracked and modeled. The data may be used to perform a preventative maintenance action. This allows for various types of maintenance actions comprising more exhaustive diagnostics to be done during routine maintenance where information is offloaded and diagnosed as part of, for example, fleet maintenance. In this manner, an intelligent database can be created by a maintenance crew using data to profile battery life and performance, as well as a charging system response.

By using the battery health diagnostics system described herein, an over reactive or under active charging system, as well as an unhealthy cell within a secondary battery, can be tagged for early maintenance creating further savings through unscheduled maintenance. Battery health and prognostics as well as battery optimal operation/anomaly-safe characteristics such as over current, over temperature or deep discharge can be used for battery maintenance.

In an embodiment, a method for battery health diagnostics measures at least one battery property of a battery in real-time to provide measured data, and tracks at least one measurement time at which the measured data is measured. The method further provides a battery history model by adaptively modeling the measured data and the measurement time, and estimates a future state of the battery based on the battery history model.

In another embodiment, a battery adaptive learning management system comprises measurement logic, adaptive logic, and prediction logic. The measurement logic measures at least one battery property of a battery in real-time to provide measured data, and tracks at least one measurement time at which the measured data is measured. The adaptive logic provides a battery history model by adaptively modeling the measured data and the at least one measurement time. The prediction logic estimates a future state of the battery based on the battery history model.

In yet another embodiment, a computer readable storage medium comprises computer-executable instructions for performing a method for battery health diagnostics. The method executed by the computer-executable instructions measures at least one battery property of a battery in real-time to provide measured data, and tracks at least one measurement time at which the measured data is measured. The method executed by the computer-executable instructions also provides a battery history model by adaptively modeling the measured data and the measurement time, and estimates a future state of the battery based on the battery history model.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF DRAWINGS

A more complete understanding of embodiments of the present disclosure may be derived by referring to the detailed description and claims when considered in conjunction with the following figures, wherein like reference numbers refer to similar elements throughout the figures. The figures are provided to facilitate understanding of the disclosure without limiting the breadth, scope, scale, or applicability of the disclosure. The drawings are not necessarily made to scale.

DETAILED DESCRIPTION

The following detailed description is exemplary in nature and is not intended to limit the disclosure or the application and uses of the embodiments of the disclosure. Descriptions of specific devices, techniques, and applications are provided only as examples. Modifications to the examples described herein will be readily apparent to those of ordinary skill in the art, and the general principles defined herein may be applied to other examples and applications without departing from the spirit and scope of the disclosure. The present disclosure should be accorded scope consistent with the claims, and not limited to the examples described and shown herein.

Embodiments of the disclosure may be described herein in terms of functional and/or logical block components and various processing steps. It should be appreciated that such block components may be realized by any number of hardware, software, and/or firmware components configured to perform the specified functions. For the sake of brevity, conventional techniques and components related to batteries, and other functional aspects of systems described herein (and the individual operating components of the systems) may not be described in detail herein. In addition, those skilled in the art will appreciate that embodiments of the present disclosure may be practiced in conjunction with a variety of hardware and software, and that the embodiments described herein are merely example embodiments of the disclosure.

Embodiments of the disclosure are described herein in the context of a practical non-limiting application, namely, battery diagnostics. Embodiments of the disclosure, however, are not limited to such battery diagnostics applications, and the techniques described herein may also be utilized in other applications. For example but without limitation, embodiments may be applicable to fuel cell diagnostics, electric generator diagnostics, or other power storage device.

As would be apparent to one of ordinary skill in the art after reading this description, the following are examples and embodiments of the disclosure and are not limited to operating in accordance with these examples. Other embodiments may be utilized and structural changes may be made without departing from the scope of the exemplary embodiments of the present disclosure.

Embodiments of the disclosure provide a method to capture aspects of batteries that do not lend themselves to analytical methods due to a complexity and non-linearity of a dynamical system. Embodiments of the disclosure provide a relatively small, low cost and very low energy microprocessor with onboard memory to store data comprising original equipment manufacturer (OEM) battery characteristics, battery operational history such as current, voltage, charge and discharge cycles dates, as well as other parameters of significance. Embodiments provide adaptive techniques for optimizing battery service characteristics as well as battery system maintenance, and therefore provide data and information for advanced maintenance action for a battery.

Figure 1:
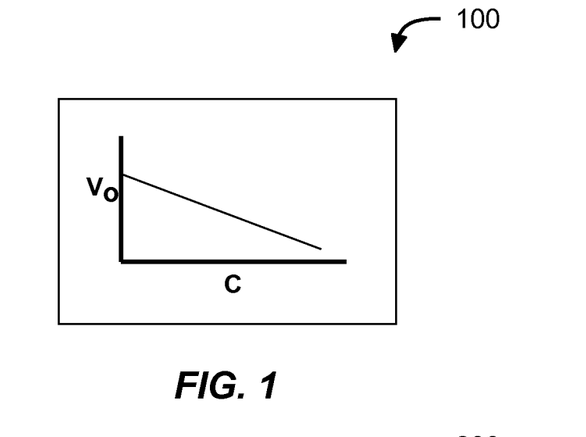
FIG. 1 is an illustration of an exemplary diagram of battery capacity as a function of battery open circuit voltage for a lead acid battery.

FIG. 1 is an illustration of an exemplary diagram of battery capacity C as a function of battery open circuit voltage Vo for a lead acid battery. Dependent on a type of battery, battery capacity may be a linear function of open circuit voltage, such as in the lead acid battery. For other types of battery chemistries such as Nickel Cadmium or Lithium Ion, the voltage Vo vs. capacity C curve is not as good of an indicator of battery capacity.

Figure 2:
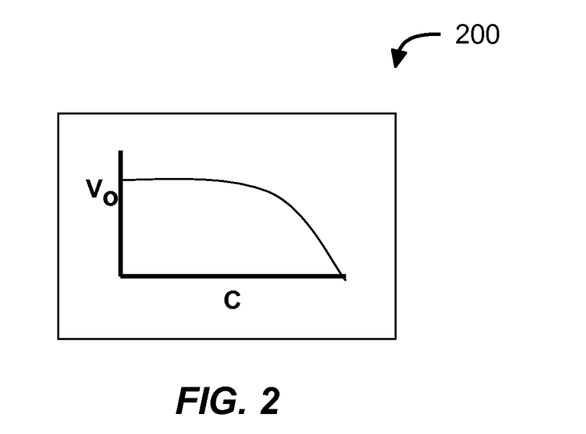
FIG. 2 is an illustration of an exemplary diagram of battery capacity as a function of battery open circuit voltage such as a nickel cadmium battery or a lithium Ion battery where the voltage is relatively constant throughout much of a discharge cycle.

FIG. 2 is an illustration of an exemplary diagram of battery capacity C as a function of battery open circuit voltage Vo for a battery such as a nickel cadmium battery or a lithium Ion battery where the voltage is relatively constant throughout much of a discharge cycle. A shape of a discharge curve is a function of stoichiometry that comprises, for example but without limitation, oxidation/reduction, electrochemical energy (electromotive force (EMF)), cell construction, or other factor.

Figure 3:
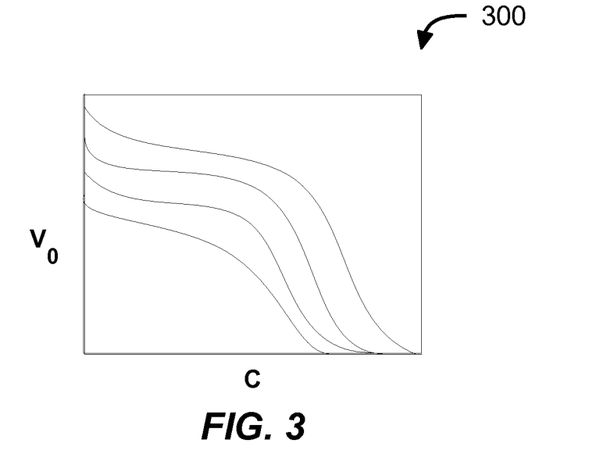
FIG. 3 is an illustration of an exemplary diagram of battery capacity degradation over time as a function of battery open circuit voltage that illustrates one aspect of changes over time.

FIG. 3 is an illustration of an exemplary diagram of battery capacity C degradation over time as a function of battery open circuit voltage Vo that illustrates one aspect of changes over time. A battery chemistry for FIG. 3 is non-linear, with additional variability introduced due to cell construction such as anode/cathode design as well as manufacturing variability. Nonlinear behavior due to fabrication, usage, environmental conditions, charging profiles, or other cause, can contribute to significant nonlinear capacity and charging profile compatibility. FIG. 3 is illustrative of a time variance and changes of states of a battery as characterized by calculated battery characteristics, such as but without limitation, capacity, state of charge, internal cell resistance, or other calculated battery characteristic.

Figure 4:
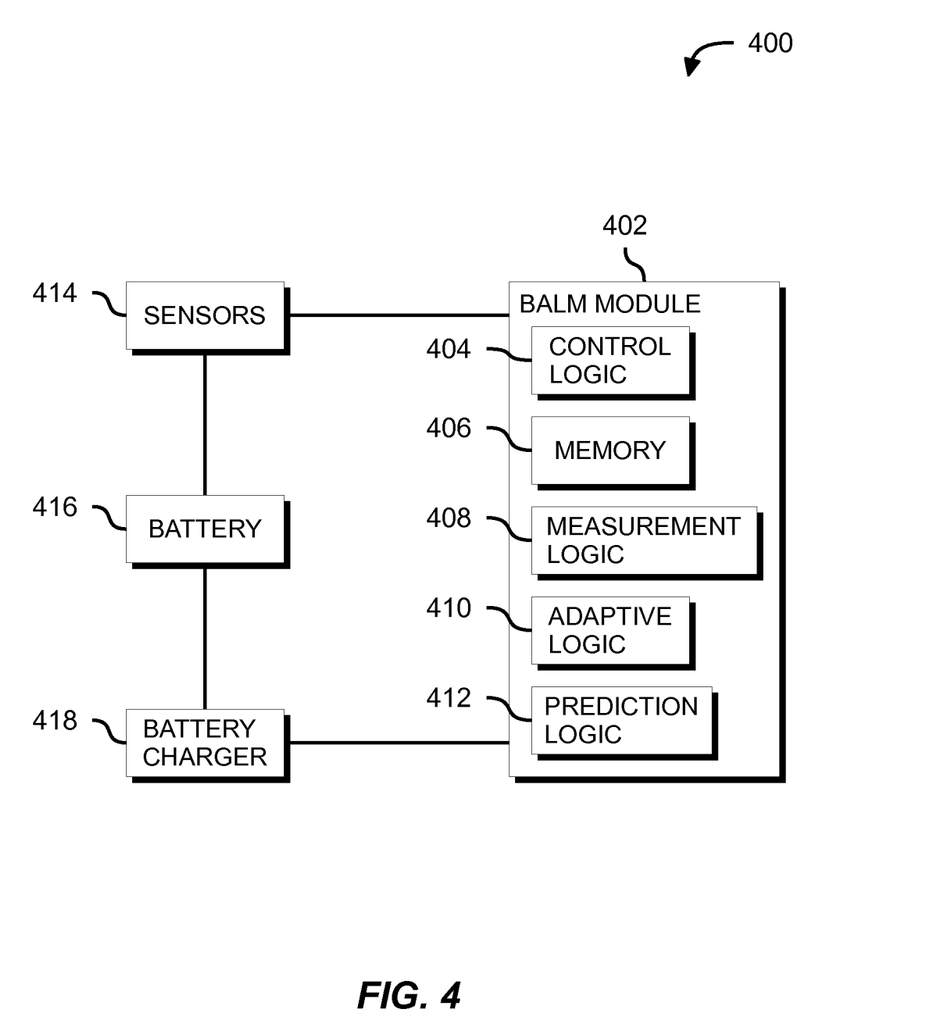
FIG. 4 is an illustration of an exemplary functional block diagram of a battery adaptive learning management system according to an embodiment of the disclosure.

FIG. 4 is an illustration of an exemplary functional block diagram of a battery adaptive learning management system 400 (system 400) according to an embodiment of the disclosure. A practical system 400 may comprise any number of batteries, any number of processor modules, any number of memories, any number of sensors, and any number of other modules. The illustrated system 400 depicts a simple embodiment for ease of description. These and other elements of the system 400 are interconnected together, allowing communication between the various elements of system 400. In one embodiment, these and other elements of the system 400 may be interconnected together via coupling circuits (not shown). Those of skill in the art will understand that the various illustrative blocks, modules, circuits, and processing logic described in connection with the embodiments disclosed herein may be implemented in hardware, computer-readable software, firmware, or any practical combination thereof.

To illustrate clearly this interchangeability and compatibility of hardware, firmware, and software, various illustrative components, blocks, modules, circuits, and steps are described generally in terms of their functionality. Whether such functionality is implemented as hardware, firmware, or software depends upon the particular application and design constraints imposed on the overall system. Those familiar with the concepts described herein may implement such functionality in a suitable manner for each particular application, but such implementation decisions should not be interpreted as causing a departure from the scope of the present disclosure.

The system 400 may comprise a battery 416, sensors 414, a battery charger 418, and a battery adaptive learning management (BALM) module 402 (BALM module 402).

The battery 416 may be any battery type known in the art, such as but without limitation, lithium-ion, nickel-metal-hydride, nickel-cadmium, or other battery. Battery capacity for a given size battery depends on temperature, cut off voltage, charge/discharge or other battery parameter, and health of the battery 416 depends on battery capacity relative to an initial specification of the battery, e.g., from an original equipment manufacturer (OEM). In this regard, operating status parameters may indicate, for example, a current percentage of assumed (e.g., specified) capacity for the battery or battery network. A maximum actual capacity (e.g., health) of a battery may be determined by measuring voltage, current, and temperature during charge and discharge cycles, and comparing those measurements to data sets known to represent various levels of health.

Battery capacity is an amount of current a fully charged battery can supply for a given period of time without having a terminal voltage fall below a certain voltage at a given temperature. Battery capacity refers to a total amount of energy stored within a battery. Rated capacity may be measured in ampere-hours (amp-hour), which is a product of a current multiplied by a number of hours to total discharge.

There are a number of factors that dictate a capacity of a given battery, for example but without limitation: a size (e.g., a volume and plate area of a battery increases with capacity); a temperature (e.g., as a battery gets colder its capacity decreases); a cut off voltage (e.g., to prevent damage, a cut-off voltage should be limited to a certain voltage); a discharge rate (e.g., a rate of discharge, measured in amperes—as the discharge rate goes up, a capacity goes down); a history (e.g., deep discharging, excessive cycling, age, over charging, and under charging all reduce capacity), or other factor.

The sensors 414 are coupled directly or indirectly to the battery 416. The sensors 414 are operable to sense properties of the battery 416, such as but without limitation, a battery voltage, a battery current, a battery temperature, an operational environment, or other property.

The battery charger 418 is operable to charge a rechargeable battery by forcing an electric current through the rechargeable battery. A charge current depends on a technology and a capacity of a battery being charged.

The BALM module 402 comprises measurement logic 408, adaptive logic 410, prediction logic 412, control logic 404 and memory 406. The BALM module 402 is operable to receive data in the measurement logic 408 from the sensors 414, store the data in the memory 406, create an adaptive model using the adaptive logic 410, and predict future performance of the battery 416 using the prediction logic 412.

The measurement logic 408 is coupled to the sensors 414, and is operable to receive real-time sensed data from the sensors 414, and measure, at least one battery property of the battery 416 when the real-time sensed data is received. The measurement logic 408 is further operable to format and log/store measured data in the memory 406 and track at least one measurement time at which the measured data is measured.

The adaptive logic 410 is operable to provide a model of the battery 416 based on the measured data utilizing self-learning or adaptive control with empirical data (e.g., input/output control techniques) to characterize and manage a dynamic system. In this manner, the adaptive logic 410 provides a battery history model by adaptively modeling the measured data and the at least one measurement time. One of the approaches to this type of methodology is to employ the empirical data to develop adjusted battery characteristics for battery health and prognostics. This can be used for battery maintenance as well as battery optimal operation/anomaly-safe characteristics such as over current, over temperature or deep discharge. The adaptive logic 410 may comprise, for example but without limitation, a fuzzy control model, a neural system model, or other model.

The battery 416 is generally too complex to analytically model and utilized classical control theory and methodology, and therefore an empirical approach may be more accurate for a complex dynamic non-linear system. Battery parameters such as battery capacity and state-of-charge may be monitored via monitoring, for example but without limitation, battery voltage, current, temperature, time, or other parameter. The state-of-charge and battery capacity may be continuously assessed and updated. An intelligent database can be created by, for example, maintenance crew, using data to profile battery life and performance, as well as charging system response.

The prediction logic 412 is configured to estimate a future state of the battery 416 based on a present state of the battery 416 and a previous state of the battery 416 using the battery history model. Prognostics can be provided to a system based on the state-of-charge and battery capacity. The prognostics can then be used to determine reliability-and-maintainability requirements, which can be used to realize a net profit gain through, for example but without limitation, reduction of waste through early replacement, unscheduled replacement maintenance cost through early detection of an unexpected degradation rate, meeting industry standard replacement scheduling and part ordering, or other requirement measures.

This allows for various types of maintenance actions including, for example, more exhaustive diagnostics to be done during routine maintenance where information is offloaded and diagnosed as part of fleet maintenance. An over reactive or under active charging battery system can be tagged for early maintenance creating further savings through unscheduled maintenance. Currently, battery replacement in vehicles is based on hard time replacement, scheduled maintenance intervals or anomaly—as is the case in the automotive industry.

The prediction logic 412 is further configured to estimate/calculate, for example but without limitation, a change in a battery property between a previous state and a present state of the battery 416, a rate of change of the battery property, a health state of the battery 416 using the battery history model, or other similar estimate. The prediction logic 412 is also configured to forecast (assess) a prognostic for a battery reliability-and-maintainability using the battery history model, and report the prognostic of the battery 416. The reliability-and-maintainability (assessment) comprises, for example but without limitation, a health state, a battery capacity warning, a state-of-charge, a potential anomaly, a thermal run-away warning, a need for maintenance, a system warning, a shutdown warning, a battery replacement need, or other assessment.

The prediction logic 412 is also configured, for example but without limitation, to determine a battery energy capacity, and determine state of charge based on the battery property, indicate one of: a shorted cell, a discharged cell, and an under discharged cell, if a temperature change is too rapid, or other information.

The control logic 404 comprises processing logic that is configured to carry out the functions, techniques, and processing tasks associated with the operation of the system 400. In particular, the processing logic is configured to support the system 400 described herein. The control logic 404 may be implemented, or realized, with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein. In this manner, a processor may be realized as a microprocessor, a controller, a microcontroller, a state machine, or the like.

A processor may also be implemented as a combination of computing devices, e.g., a combination of a digital signal processor and a microprocessor, a plurality of microprocessors, one or more microprocessors in conjunction with a digital signal processor core, or any other such configuration. The memory 406 may comprise a data storage area with memory formatted to support the operation of the system 400.

The memory 406 is configured to store, maintain, and provide data as needed to support the functionality of the system 400. For example, the memory 406 may store data such as a battery voltage, a battery current, a battery temperature, a date, capacity of a battery, charge and discharge cycles, time intervals of measurements, or other data.

For example, data may be used to perform preventative maintenance action. As mentioned above, this allows for various types of maintenance actions including more exhaustive diagnostics to be done during routine maintenance where information is offloaded and diagnosed as part of fleet maintenance. An intelligent database can be created by maintenance using data to profile battery life and performance, as well as charging system response.

In practical embodiments, the memory 406 may comprise, for example but without limitation, a non-volatile storage device (non-volatile semiconductor memory, hard disk device, optical disk device, and the like), a random access storage device (for example, SRAM, DRAM), or any other form of storage medium known in the art. The non-volatile memory may be used to store the measured data, the measurement time, and the battery history model.

The memory 406 may be coupled to the control logic 404 and configured to store, for example but without limitation, a database comprising the data mentioned above, an intelligent database, a computer program that is executed by the control logic 404, an operating system, an application program, tentative data used in executing a program, or other application. Additionally, the memory 406 may represent a dynamically updating database comprising a table for updating the database. The memory 406 may be coupled to the control logic 404 such that the control logic 404 can read information from and write information to the memory 406. For example, as mentioned above, the control logic 404 may access the memory 406 to access the a battery voltage, a battery current, a battery temperature, previously calculated battery capacity and/or state of charge of a battery, charge and discharge cycles, time intervals of measurements, or other battery information related to health of the battery.

As an example, the control logic 404 and memory 406 may reside in respective application specific integrated circuits (ASICs). The memory 406 may also be integrated into the control logic 404. In an embodiment, the memory 406 may comprise a cache memory for storing temporary variables or other intermediate information during execution of instructions to be executed by the control logic 404.

Figure 5:
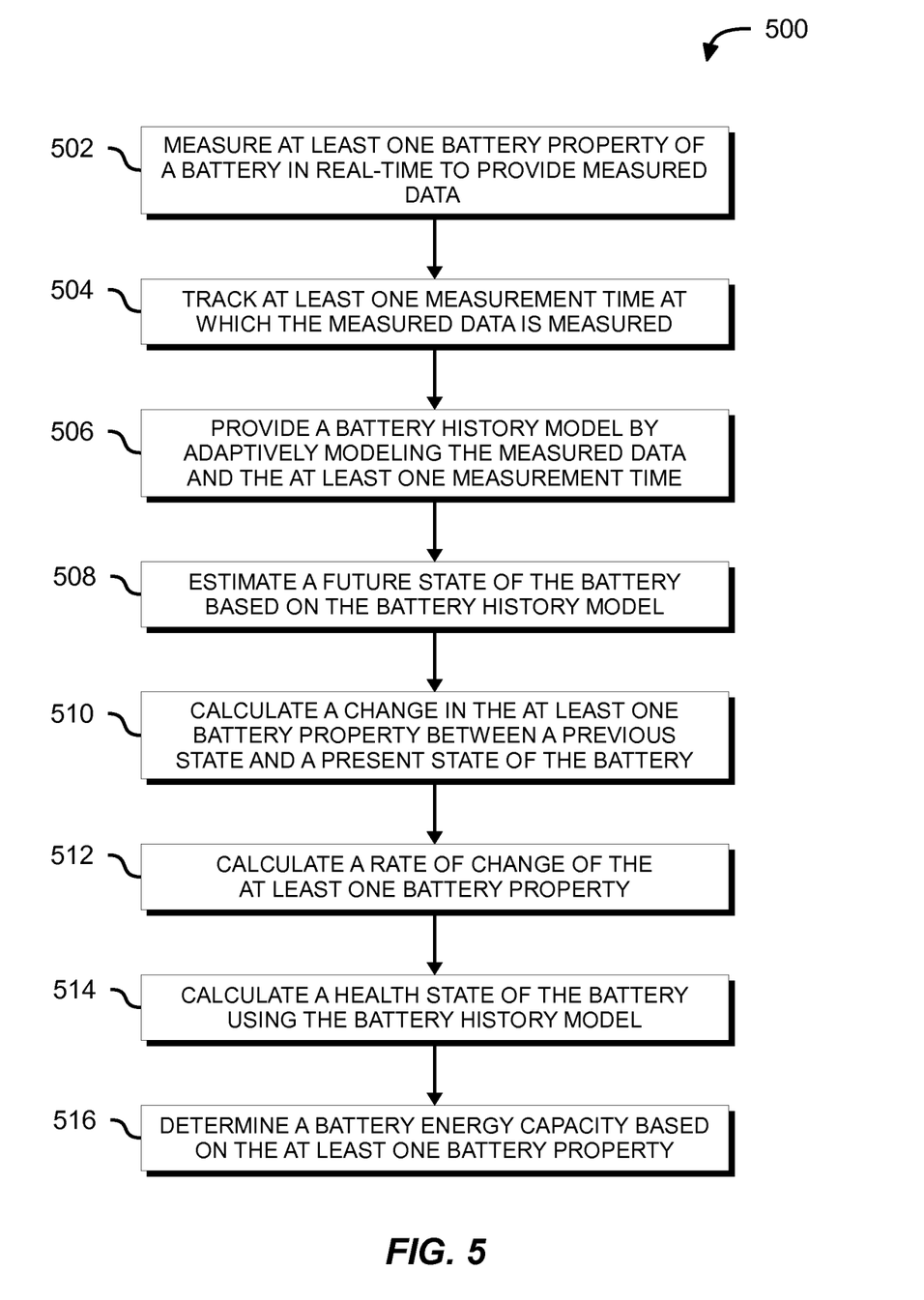
FIG. 5 is an illustration of an exemplary flowchart showing a battery health diagnostics process according to an embodiment of the disclosure.

FIG. 5 is an illustration of an exemplary flowchart showing a battery health diagnostics process 500 according to an embodiment of the disclosure. The various tasks performed in connection with process 500 may be performed mechanically, by software, hardware, firmware, a computer-readable medium having computer executable instructions for performing the processes methods, or any combination thereof. For illustrative purposes, the following description of the process 500 may refer to elements mentioned above in connection with FIG. 4.

It should be appreciated that the process 500 may include any number of additional or alternative tasks, the tasks shown in FIG. 5 need not be performed in the illustrated order, and the process 500 may be incorporated into a more comprehensive procedure or process having additional functionality not described in detail herein. In practical embodiments, portions of the process 500 may be performed by different elements of the system 400 such as: the battery 416, the sensors 414, the battery charger 418, the BALM module 402, etc. Process 500 may have functions, material, and structures that are similar to the embodiments shown in FIG. 4. Therefore, common features, functions, and elements may not be redundantly described here.

Process 500 may begin by measurement logic such as the measurement logic 408 measuring at least one battery property of a battery such as the battery 416 in real-time to provide measured data (task 502). As mentioned above, the battery property may comprise, for example but without limitation, a voltage, a current, a cell resistance (e.g., calculated by the voltage divided by the current), an operational environment, a temperature, a charge state, or other property.

Process 500 may continue by the measurement logic 408 tracking at least one measurement time at which the measured data is measured (task 504).

Process 500 may continue by the adaptive logic 410 providing a battery history model by adaptively modeling the measured data and the at least one measurement time (task 506). The history model comprises empirical data and derived data such as state of charge and capacity.

Process 500 may continue by the prediction logic 412 estimating a future state of the battery based on the battery history model (task 508).

Process 500 may continue by the adaptive logic 410 calculating a change in the at least one battery property between a previous state and a present state of the battery 416 (task 510).

Process 500 may continue by the adaptive logic 410 calculating a rate of change of the at least one battery property (task 512).

Process 500 may continue by the adaptive logic 410 calculating a health state of the battery 416 using the battery history model (task 514).

Process 500 may continue by the adaptive logic 410 determining a battery energy capacity based on the at least one battery property (task 516).

Process 500 may continue by the adaptive logic 410 reporting the battery energy capacity (task 518).

Process 500 may continue by the adaptive logic 410 determining a state of charge based on the at least one battery property (task 520).

Process 500 may continue by the adaptive logic 410 reporting the state of charge (task 522).

Process 500 may continue by the adaptive logic 410 indicating one of a shorted cell, a discharged cell, and an under discharged cell, if a temperature change is too rapid (task 524).

Process 500 may continue by the prediction logic 412 forecasting a prognostic for a battery reliability-and-maintainability using the battery history model (task 526).

Process 500 may continue by the prediction logic 412 reporting the prognostic of the battery 416 (task 528).

Process 500 may continue by the prediction logic 412 reporting a reliability-and-maintainability assessment of the battery 416 based on the prognostic (task 530). As mentioned above, the reliability-and-maintainability assessment may comprise, for example but without limitation, a health state, a battery capacity warning, a state-of-charge, a potential anomaly, a thermal run-away warning, a need for maintenance, a system warning, a shutdown warning, a battery replacement need, or other assessment.

In this manner, embodiments of the disclosure provide a small, low cost and low energy system with onboard memory for the battery operational history tracking and modeling data. The data may be used to perform preventative maintenance action thereby allowing for various types of maintenance actions including more exhaustive diagnostics to be done during routine maintenance where information is off-loaded and diagnosed as part of fleet maintenance.

The term real-time refers to a signal that is continuously being sent and received, with little or no time delay. The term near-real-time refers to a real-time signal with substantially no significant time delay. The time delay may be a delay introduced by, for example but without limitation, automated data processing or network transmission, between occurrence of an event, and the like. In this document, the term real-time refers to both real-time and near-real-time.

In this document, the terms "computer program product", "computer-readable medium", "computer readable storage medium", and the like may be used generally to refer to media such as, for example, memory, storage devices, or storage unit. These and other forms of computer-readable media may be involved in storing one or more instructions for use by the control logic 404 to cause the control logic 404 to perform specified operations. Such instructions, generally referred to as "computer program code" or "program code" (which may be grouped in the form of computer programs or other groupings), when executed, enable power utilization scheduling methods of the system 400.

The above description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although FIGS. 4-5 depict example arrangements of elements, additional intervening elements, devices, features, or components may be present in an embodiment of the disclosure.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future.

Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

As used herein, unless expressly stated otherwise, "operable" means able to be used, fit or ready for use or service, usable for a specific purpose, and capable of performing a recited or desired function described herein. In relation to systems and devices, the term "operable" means the system and/or the device is fully functional and calibrated, comprises elements for, and meets applicable operability requirements to perform a recited function when activated. In relation to systems and circuits, the term "operable" means the system and/or the circuit is fully functional and calibrated, comprises logic for, and meets applicable operability requirements to perform a recited function when activated.

The invention claimed is:

1. A method for battery health diagnostics, comprising:
   measuring at least one battery property of a battery in real-time to provide measured data;
   tracking at least one measurement time at which the measured data is measured;
   providing a battery history model by adaptively modeling the measured data and the at least one measurement time using adaptive logic;
   estimating a future state of the battery based on the battery history model; and
   forecasting a prognostic for a battery reliability-and-maintainability comprising a thermal run-away assessment using the battery history model.

2. The method of claim 1, wherein the at least one battery property comprises at least one member selected from the group consisting of: a capacity, a charge state, a voltage, a current, a cell resistance, an operational environment, and a temperature.

3. The method of claim 1, further comprising calculating a change in the at least one battery property between a previous state and a present state of the battery.

4. The method of claim 1, further comprising calculating a rate of change of the at least one battery property.

5. The method of claim 1, further comprising calculating a health state of the battery using the battery history model.

6. The method of claim 1, further comprising reporting the prognostic of the battery.

7. The method of claim 1, further comprising reporting a reliability-and-maintainability assessment of the battery based on the prognostic.

8. The method of claim 7, wherein the reliability-and-maintainability assessment comprises at least one member selected from the group consisting of: a health state, a battery capacity warning, a state-of-charge, a potential anomaly, a thermal run-away warning, a need for maintenance, a system warning, a shutdown warning, and a battery replacement need.

9. The method of claim 1, further comprising determining a battery energy capacity based on the at least one battery property.

10. The method of claim 1, further comprising determining a state of charge based on the at least one battery property.

11. The method of claim 1, further comprising indicating one of a shorted cell, an discharged cell, and an under discharged cell, if a temperature change is too rapid.

12. The method of claim 1, wherein the battery history model comprises a fuzzy control model.

13. The method of claim 1, wherein the battery history model comprises a neural system model.

14. A battery adaptive learning management system comprising:
   measurement logic operable to:
      measure at least one battery property of a battery in real-time to provide measured data; and
      track at least one measurement time at which the measured data is measured;
   adaptive logic operable to provide a battery history model by adaptively modeling the measured data and the at least one measurement time; and
   prediction logic operable to:
      estimate a future state of the battery based on the battery history model; and
      forecast a prognostic for a battery reliability-and-maintainability comprising a thermal run-away assessment using the battery history model.

15. The battery adaptive learning management system of claim 14, further comprising a non-volatile memory operable to store the measured data, the at least one measurement time, and the battery history model.

16. The battery adaptive learning management system of claim 14, wherein the battery adaptive learning management system is coupled to the battery.

17. A computer readable storage medium comprising computer-executable instructions for performing a method for battery health diagnostics, the method executed by computer-executable instructions comprising:
   measuring at least one battery property of a battery in real-time to provide measured data;
   tracking at least one measurement time at which the measured data is measured;
   providing a battery history model by adaptively modeling the measured data and the at least one measurement time using adaptive logic;
   estimating a future state of the battery based on the battery history model; and
   forecasting a prognostic for a battery reliability-and-maintainability comprising a thermal run-away assessment using the battery history model.

18. The computer readable storage medium of claim 17, wherein the at least one battery property comprises at least one member selected from the group consisting of: a capacity, a charge state, a voltage, a current, a cell resistance, an operational environment, and a temperature.

19. The computer readable storage medium of claim 17, further comprising computer-executable instructions for calculating:
   a change in the at least one battery property between a previous state and a present state of the battery;
   a rate of change of the at least one battery property; and
   a health state of the battery using the battery history model.

20. The computer readable storage medium of claim 17, further comprising computer-executable instructions for reporting:
   the prognostic of the battery; and
   a reliability-and-maintainability assessment of the battery based on the prognostic.

* * * * *